United States Patent
Lin et al.

(10) Patent No.: US 11,196,425 B1
(45) Date of Patent: Dec. 7, 2021

(54) EYE WIDTH MONITOR AND RELATED METHOD OF DETECTING EYE WIDTH

(71) Applicant: NOVATEK Microelectronics Corp., Hsin-Chu (TW)

(72) Inventors: Che-Yi Lin, Hsinchu (TW); Yung-Cheng Lin, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/996,876

(22) Filed: Aug. 18, 2020

(51) Int. Cl.
*H03D 3/24* (2006.01)
*H03L 7/08* (2006.01)
*H03L 7/091* (2006.01)
*H03L 7/099* (2006.01)
*H03L 7/081* (2006.01)

(52) U.S. Cl.
CPC .......... *H03L 7/0807* (2013.01); *H03L 7/0818* (2013.01); *H03L 7/091* (2013.01); *H03L 7/0991* (2013.01)

(58) Field of Classification Search
CPC ..... H03L 7/0807; H03L 7/091; H03L 7/0991; H03L 7/0818; H03L 7/0995

USPC ........ 375/373–376, 355, 326, 327, 257, 258
See application file for complete search history.

(56) References Cited

U.S. PATENT DOCUMENTS

2007/0096785 A1*  5/2007  Maeda .................. H03L 7/0995
                                                        327/158

* cited by examiner

Primary Examiner — Phuong Phu
(74) Attorney, Agent, or Firm — Winston Hsu

(57) ABSTRACT

An eye width monitor (EWM) for a clock and data recovery (CDR) circuit includes a delay circuit, a first multiplexer (MUX) and a calibration circuit. The delay circuit includes an input terminal and an output terminal. The first MUX, coupled to the delay circuit, includes a first input terminal, a second input terminal and an output terminal. The first input terminal of the first MUX is coupled to a clock input terminal of the EWM. The second input terminal of the first MUX is coupled to the output terminal of the delay circuit. The output terminal of the first MUX is coupled to the input terminal of the delay circuit. The calibration circuit, coupled to the delay circuit, is configured to receive an oscillation clock from the delay circuit and receive a reference clock, and calibrate the oscillation clock with the reference clock.

8 Claims, 10 Drawing Sheets

EYE WIDTH MONITOR AND RELATED METHOD OF DETECTING EYE WIDTH

BACKGROUND OF THE INVENTION

1. Field of the Invention

The present invention relates to an eye width monitor (EWM) and a related method of detecting eye width, and more particularly, to an EWM for a clock and data recovery (CDR) circuit and a related method of detecting the eye width of the input data of the CDR circuit.

2. Description of the Prior Art

Please refer to FIG. 1, which briefly shows the circuit structure of a high-speed data receiver 10. The high-speed data receiver 10 includes an equalizer (EQ) 102 and a clock and data recovery (CDR) circuit 104. The EQ 102 is configured to compensate possible signal losses generated on the channel. The CDR circuit 104 is configured to extract the clock signal embedded in the received data signals. The high-speed data receiver 10 may be implemented as an integrated circuit (IC) included in a chip.

In general, an external test may be applied to obtain the eye width of the input data of the high-speed data receiver 10. However, it is impossible to obtain the eye width of an internal signal between the EQ 102 and the CDR circuit 104 inside the high-speed data receiver 10 (such as the input data of the CDR circuit 104) through the external test. In order to acquire the eye width of the data signals after equalization, the IC should further include an eye width monitor (EWM) to detect the signals inside the IC, which increases the costs and complexity of the circuitry.

An easier and simpler eye width detection scheme applies a delay line to generate multiple clock phases, and the eye width detection may be realized by including a delay circuit and a sampler circuit only. However, the delay value of the delay line easily deviates due to variations of process, voltage and temperature (PVT). As a result, the eye width of the signals inside the IC may not be accurately detected under large PVT variations of the delay line. Thus, there is a need for improvement over the prior art.

SUMMARY OF THE INVENTION

It is therefore an objective of the present invention to provide a novel eye width monitor (EWM), in order to accurately detect the eye width of a data signal of the clock and data recovery (CDR) circuit included in the integrated circuit (IC).

An embodiment of the present invention discloses an EWM for a CDR circuit. The EWM comprises a delay circuit, a first multiplexer (MUX) and a calibration circuit. The delay circuit comprises an input terminal and an output terminal. The first MUX, coupled to the delay circuit, comprises a first input terminal, a second input terminal and an output terminal. The first input terminal of the first MUX is coupled to a clock input terminal of the EWM. The second input terminal of the first MUX is coupled to the output terminal of the delay circuit. The output terminal of the first MUX is coupled to the input terminal of the delay circuit. The calibration circuit, coupled to the delay circuit, is configured to receive an oscillation clock from the delay circuit and receive a reference clock, and calibrate the oscillation clock with the reference clock.

Another embodiment of the present invention discloses a method of detecting an eye width of a CDR circuit. The method comprises the steps of: calibrating an oscillation clock of a delay circuit with a reference clock by connecting the delay circuit as an oscillator; determining a delay configuration of the delay circuit corresponding to the oscillation clock after being calibrated; and sampling an input data of the CDR circuit under the delay configuration corresponding to the oscillation clock after being calibrated, to detect the eye width of the input data of the CDR circuit.

Another embodiment of the present invention discloses an EWM for a CDR circuit. The EWM comprises a delay circuit, a first MUX and a frequency comparator. The delay circuit comprises an input terminal and an output terminal. The first MUX, coupled to the delay circuit, comprises a first input terminal, a second input terminal and an output terminal. The first input terminal of the first MUX is coupled to a clock input terminal of the EWM. The second input terminal of the first MUX is coupled to the output terminal of the delay circuit. The output terminal of the first MUX is coupled to the input terminal of the delay circuit. The frequency comparator, coupled to the delay circuit, is configured to receive an oscillation clock from the delay circuit and receive a reference clock, and determine a ratio of a frequency of the reference clock to a frequency of the oscillation clock.

Another embodiment of the present invention discloses a method of detecting an eye width of a CDR circuit. The method comprises the steps of: determining a ratio of a frequency of a reference clock to a frequency of an oscillation clock received from a delay circuit by connecting the delay circuit as an oscillator; sampling an input data of the CDR circuit through a plurality of sampling clocks of the delay circuit, to obtain an accurate clock number; and calculating the eye width of the input data of the CDR circuit according to the ratio and the accurate clock number.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
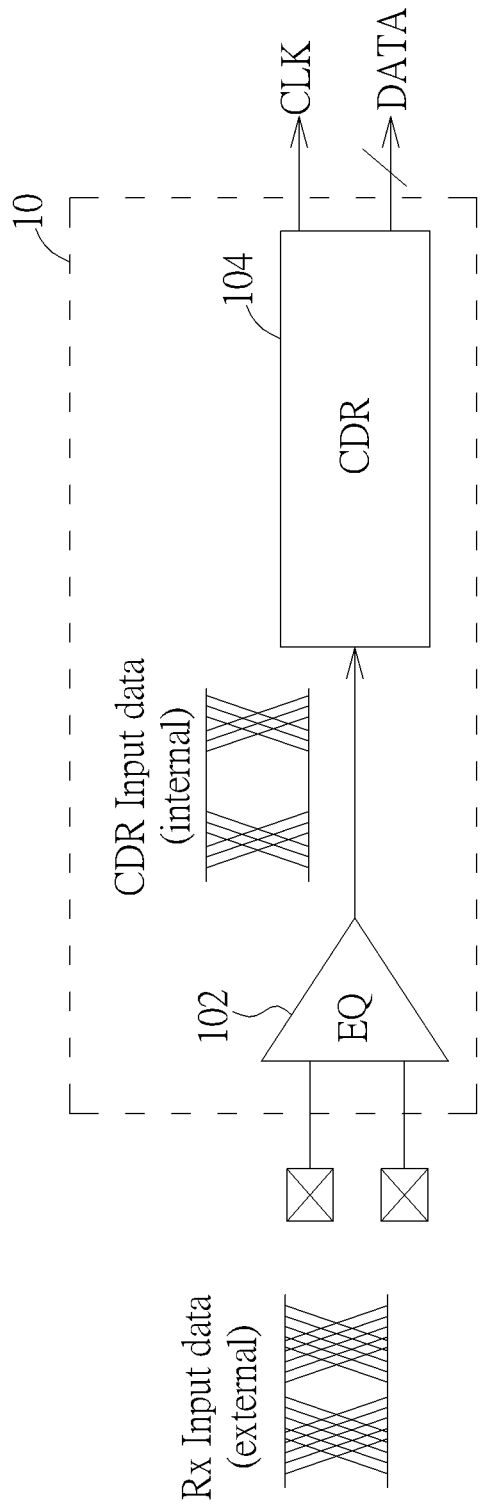
FIG. 1 is a schematic diagram of a high-speed data receiver.
Figure 2:
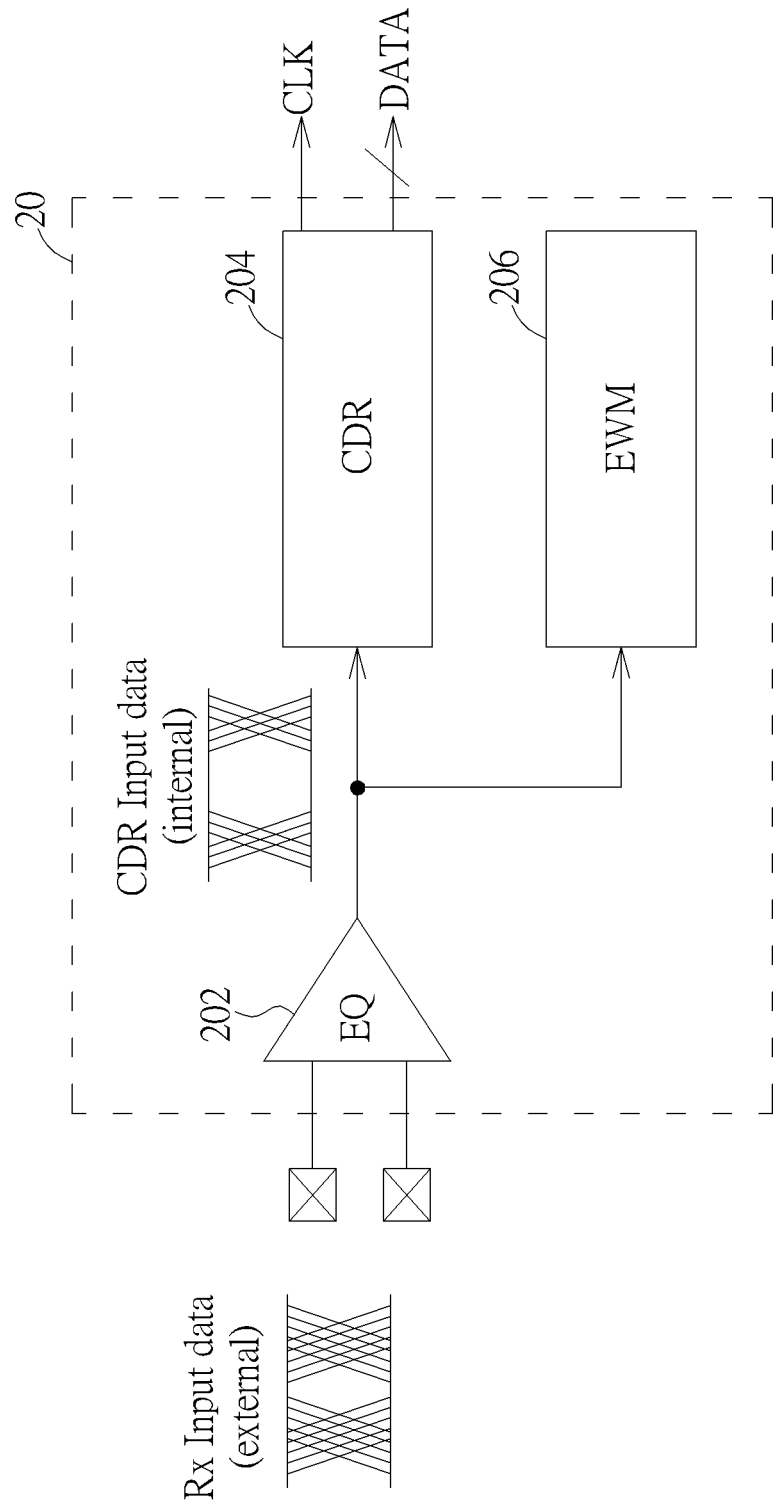
FIG. 2 is a schematic diagram of a data receiver according to an embodiment of the present invention.

Please refer to FIG. 2, which is a schematic diagram of a data receiver 20 according to an embodiment of the present invention. As shown in FIG. 2, the data receiver 20 includes an equalizer (EQ) 202, a clock and data recovery (CDR) circuit 204 and an eye width monitor (EWM) 206. The data receiver 20 may be a high-speed receiver capable of receiving high-speed data signals, and may be implemented as an integrated circuit (IC) included in a chip. The implementations and operations of the EQ 202 and the CDR circuit 204 are similar to the EQ 102 and the CDR circuit 104 shown in FIG. 1, and will not be narrated herein for brevity. In order to obtain the signal quality of the internal data signals between the EQ 202 and the CDR circuit 204, the EWM 206 may be included and coupled to the node between the EQ 202 and the CDR circuit 204 to monitor the data signals. In other words, the EWM 206 may detect the eye width of the input data of the CDR circuit 204.

As mentioned above, a delay circuit provides a simpler implementation for eye width detection, but suffers from large deviations due to process, voltage and temperature (PVT) variations. In the embodiments of the present invention, several approaches are provided to cancel or mitigate the deviations of the delay circuit, allowing the eye width detection to become feasible and reliable.

Figure 3:
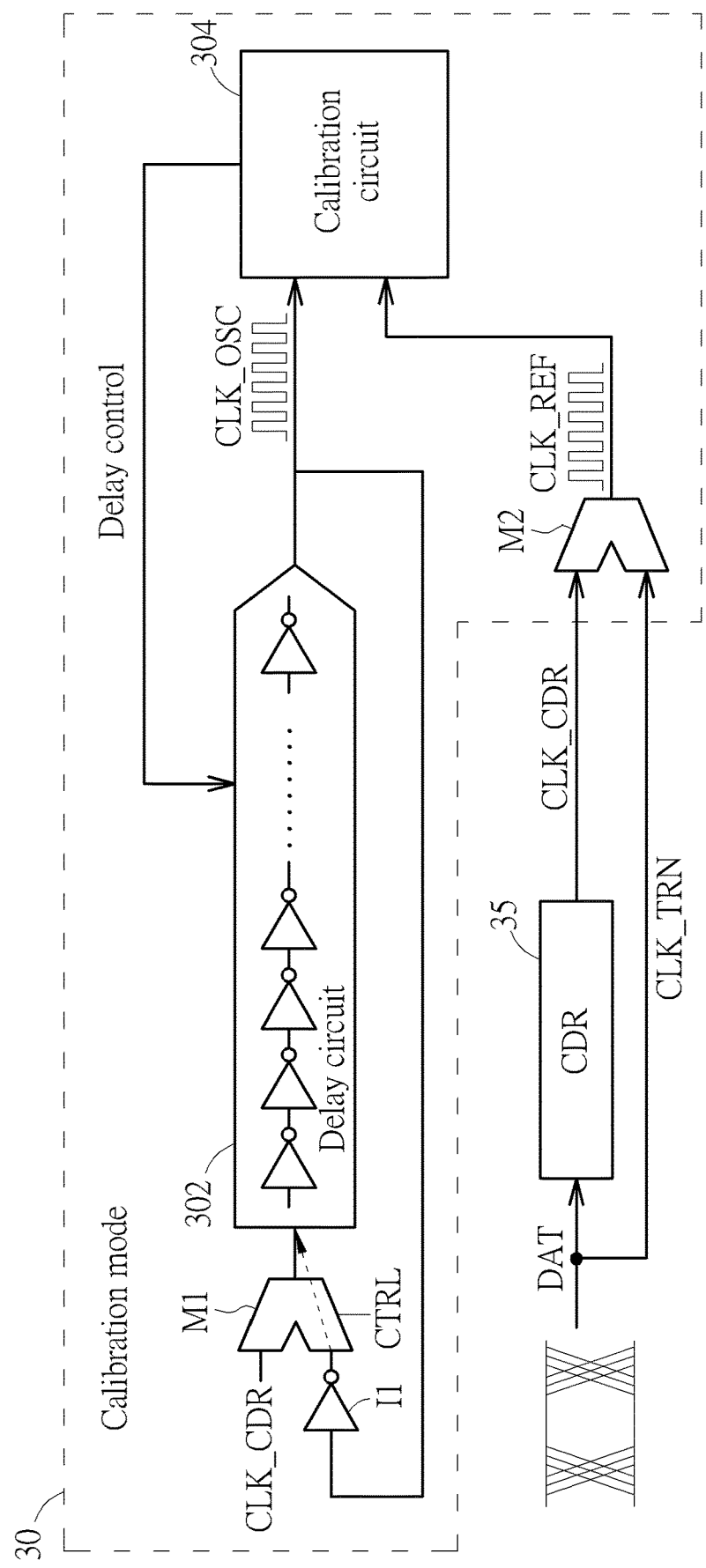
FIG. 3 is a schematic diagram of an EWM according to an embodiment of the present invention.

Please refer to FIG. 3, which is a schematic diagram of an EWM 30 according to an embodiment of the present invention. As shown in FIG. 3, the EWM 30 includes a delay circuit 302, a calibration circuit 304, and multiplexers (MUXs) M1 and M2. The EWM 30 may be implemented in a high-speed data receiver, as the EWM 206 shown in FIG. 2. The EWM 30 may be coupled to a CDR circuit 35, for detecting the eye width of an input data DAT of the CDR circuit 35. The CDR circuit 35 is configured to receive the input data DAT and correspondingly output a CDR output clock CLK_CDR extracted from the input data DAT. Further, the CDR circuit 35 may have a clock training mode, where the CDR circuit 35 receives an input training clock CLK_TRN instead of the input data DAT.

In detail, the delay circuit 302 may include a delay chain composed of a plurality of inverters, for generating and outputting multiple sampling clocks with different phases. The calibration circuit 304 is coupled to the delay circuit 302, and configured to receive an oscillation clock CLK_OSC from the delay circuit 302 and calibrate the oscillation clock CLK_OSC with a reference clock CLK_REF received from the MUX M2. The calibration circuit 304 is also configured to perform delay control on the delay circuit 302 during the calibration. The MUX M1 is coupled to the delay circuit 302. More specifically, the output terminal of the MUX M1 is coupled to the input terminal of the delay circuit 302. A first input terminal of the MUX M1 is coupled to a clock input terminal of the EWM 30, for receiving the CDR output clock CLK_CDR from the CDR circuit 35. A second input terminal of the MUX M1 is coupled to the output terminal of the delay circuit 302. The MUX M1 may receive a control signal CTRL for selecting to forward signals from the first input terminal or the second input terminal. The MUX M2 is coupled to the calibration circuit 304. More specifically, the output terminal of the MUX M2 is coupled to the calibration circuit 304. A first input terminal of the MUX M2 is coupled to the clock output terminal of the CDR circuit 35, for receiving the CDR output clock CLK_CDR from the CDR circuit 35. A second input terminal of the MUX M2 is coupled to the input terminal of the CDR circuit 35, for receiving the input training clock CLK_TRN in the clock training mode. In such a situation, one of the CDR output clock CLK_CDR and the input training clock CLK_TRN may be forwarded through the MUX M2, to be served as the reference clock CLK_REF as the basis for calibration.

FIG. 3 illustrates a calibration mode, where the control signal CTRL controls the MUX M1 to select the second input terminal to be coupled to its output terminal. In such a situation, the output terminal of the delay circuit 302 may be coupled to its input terminal, so that the delay circuit 302 is connected as an oscillator. An inverter I1 is selectively disposed between the second input terminal of the MUX M1 and the output terminal of the delay circuit 302, in order to allow signal oscillation to be feasible.

In the calibration mode, the delay circuit 302 performs oscillation and outputs the oscillation clock CLK_OSC to the calibration circuit 304. The calibration circuit 304 thereby calibrates the oscillation clock CLK_OSC based on the reference clock CLK_REF. In an embodiment, the delay circuit 302 may be implemented with a voltage controlled delay line or a digital controlled delay line, and the calibration circuit 304 may output a voltage signal or a digital signal to the delay circuit 302 correspondingly, to control the delay time of the delay circuit 302.

In an embodiment, the oscillation clock CLK_OSC may be calibrated to have the same frequency as the reference clock CLK_REF. Calibration of the oscillation clock CLK_OSC may be realized through delay control of the calibration circuit 304. More specifically, the calibration circuit 304 may control the delay configuration of the delay circuit 302, in order to adjust the frequency of the oscillation clock CLK_OSC. Therefore, after calibration, the frequency of the oscillation clock CLK_OSC may be the same as the frequency of the reference clock CLK_REF, which may be the frequency of the CDR output clock CLK_CDR or the input training clock CLK_TRN of the CDR circuit 204.

After the oscillation clock CLK_OSC is calibrated, the delay configuration such as the delay time of each delay unit may be obtained. Subsequently, the EWM 30 may be switched to operate in a clock scanning mode, where the control signal CTRL controls the MUX M1 to select the first input terminal to be coupled to its output terminal. In such a situation, the delay circuit 302 is connected to the clock input terminal for receiving the CDR output clock CLK_CDR from the CDR circuit 35. The delay circuit 302 is operated as a delay line in the clock scanning mode, while operated as an oscillator in the calibration mode.

Figure 4:
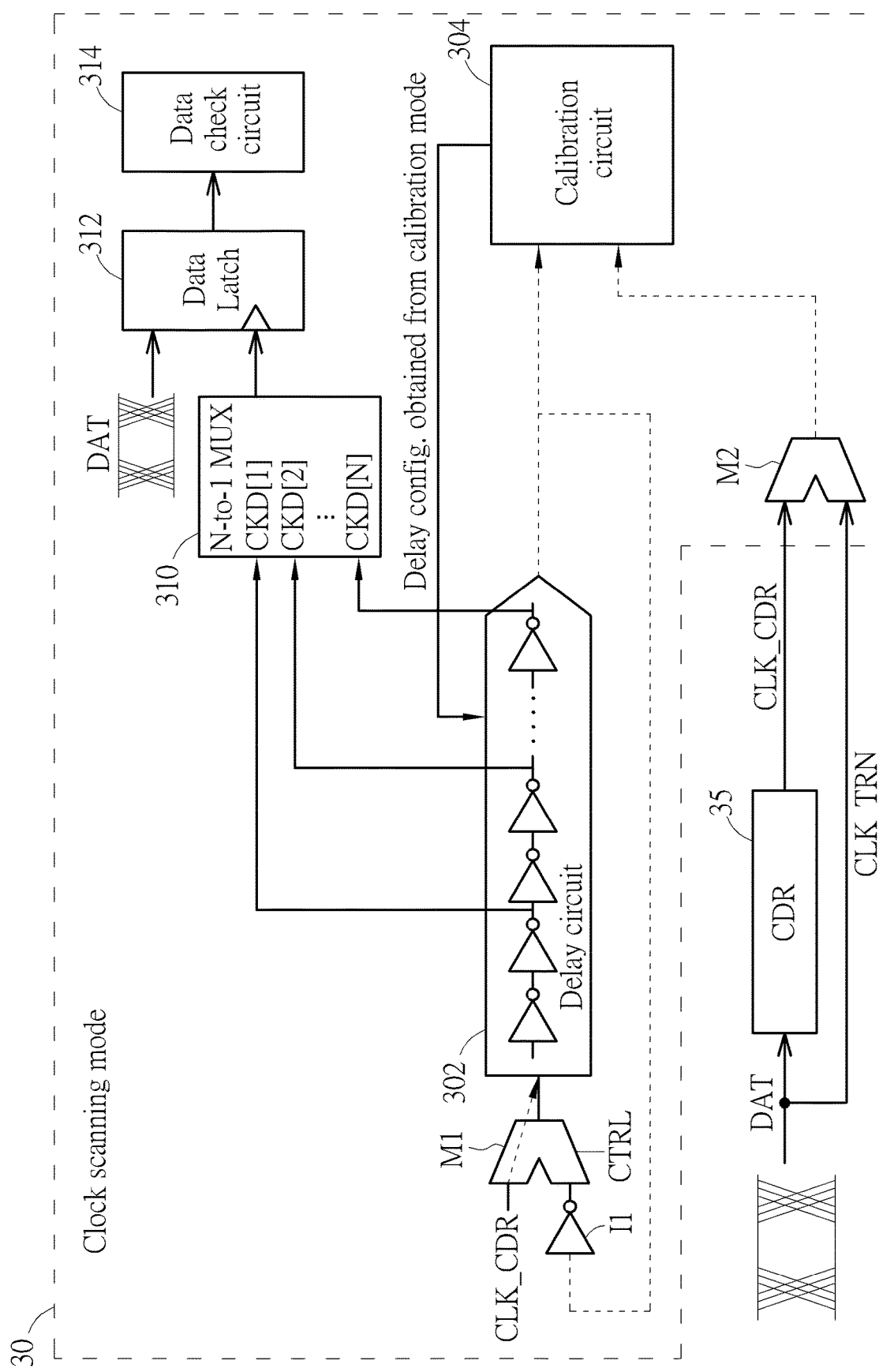
FIG. 4 is a schematic diagram of the EWM of FIG. 3 operated in the clock scanning mode.

Please refer to FIG. 4, which is a schematic diagram of the EWM 30 operated in the clock scanning mode. As shown in FIG. 4, the EWM 30 may further include an N-to-1 MUX 310, a data latch 312 and a data check circuit 314. The N-to-1 MUX 310 may receive sampling clocks CKD[1]-CKD[N] having different phases from the delay circuit 302, where the delay time (i.e., phase shift) between each sampling clock CKD[1]-CKD[N] (i.e., the delay time of each delay unit of the delay circuit 302) is known under the delay configuration corresponding to the calibrated oscillation clock generated in the calibration mode. The data latch 312 may receive the input data DAT of the CDR circuit 35, and receive the sampling clocks CKD[1]-CKD[N] from the N-to-1 MUX 310 in sequence. Therefore, the sampling clocks CKD[1]-CKD[N] may sample the input data DAT in sequence, and the data check circuit 314 may thereby determine whether the sampled value obtained from each sampling clock CKD[1]-CKD[N] is accurate.

Figure 5:
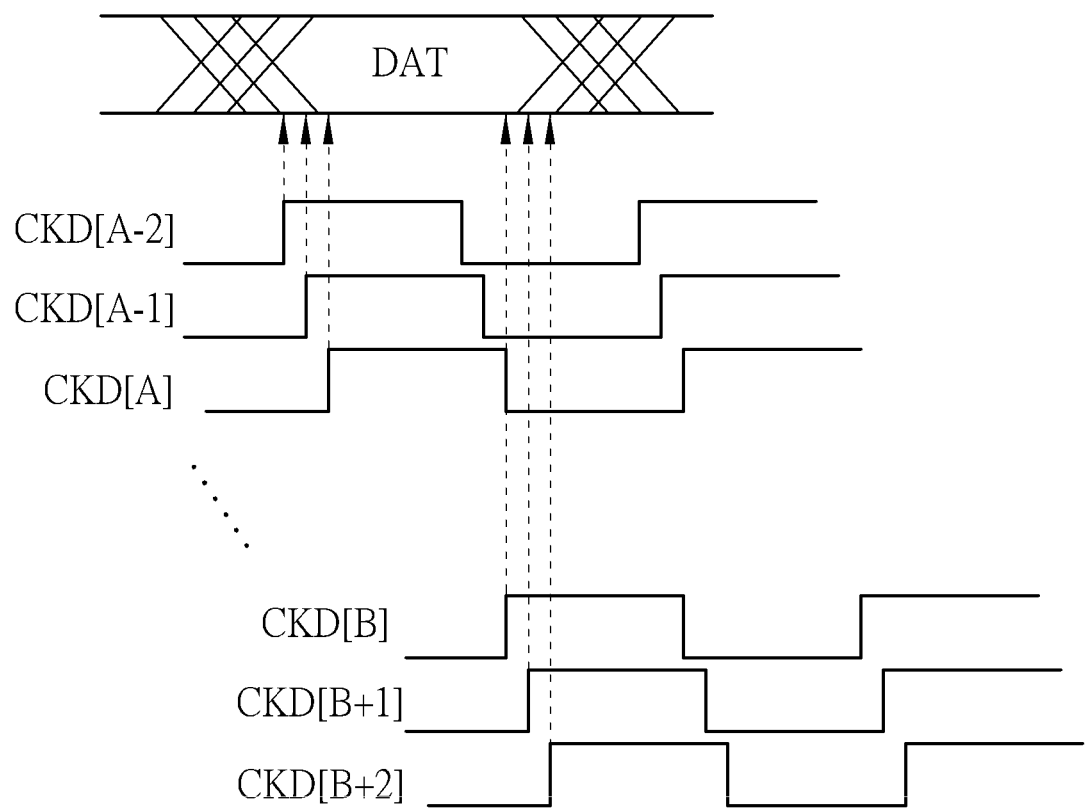
FIG. 5 is an exemplary waveform diagram of sampling the input data through the sampling clocks.

FIG. 5 is an exemplary waveform diagram of sampling the input data DAT through the sampling clocks CKD[1]-CKD[N]. As shown in FIG. 5, the accurate sampled value may be obtained through the sampling clocks from CKD[A]

to CKD[B]. Note that the oscillation clock CLK_OSC calibrated based on the reference clock CLK_REF is used to determine the delay configuration, and the delay time under the delay configuration is carried into the clock scanning mode for sampling the input data DAT. Since the delay time between each sampling clock is calibrated, the eye width of the input data DAT of the CDR circuit 35 may be accurately obtained according to the sampling results of the sampling clocks CKD[1]-CKD[N].

In the conventional eye width detection method using a delay circuit, the delay time of the delay circuit may be uncontrollable; that is, the delay time may be influenced by PVT variations and thus may possess a large deviation or error. In such a situation, the eye width may not be accurately determined based on the sampling results under unstable delay time of the sampling clocks. In comparison, in the EWM of the present invention, the delay circuit is connected as an oscillator to perform calibration before the sampling clocks are used to sample the input data. The oscillation clock generated from the oscillator is calibrated to have the same frequency as the reference clock such as the output clock or the input training clock of the CDR circuit; hence, the delay time of each delay unit in the delay circuit may be determined. The delay time will be accurate and immune to the PVT variations. In other words, the delay time of the delay circuit after calibration may be regulated to be corresponding to the average frequency of the input data signals of the CDR circuit. The average frequency is known by the receiver circuit and will be accurate after being calibrated.

Figure 6:
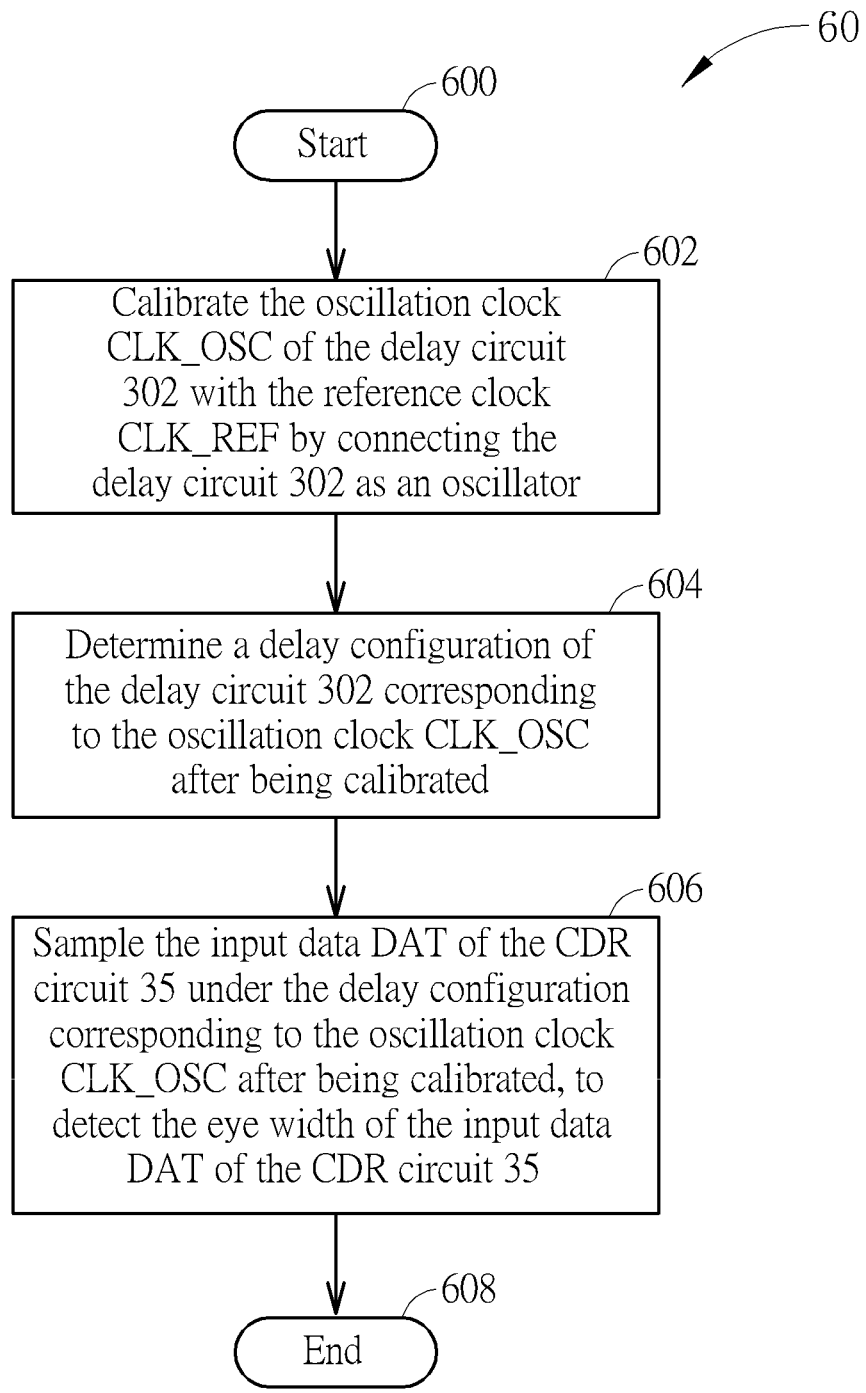
FIG. 6 is a flowchart of an eye width detection process according to an embodiment of the present invention.

The abovementioned operations of the EWM 30 may be summarized into an eye width detection process 60, as shown in FIG. 6. The eye width detection process 60 includes the following steps:

Step 600: Start.

Step 602: Calibrate the oscillation clock CLK_OSC of the delay circuit 302 with the reference clock CLK_REF by connecting the delay circuit 302 as an oscillator.

Step 604: Determine a delay configuration of the delay circuit 302 corresponding to the oscillation clock CLK_OSC after being calibrated.

Step 606: Sample the input data DAT of the CDR circuit 35 under the delay configuration corresponding to the oscillation clock CLK_OSC after being calibrated, to detect the eye width of the input data DAT of the CDR circuit 35.

Step 608: End.

The detailed implementations and operations of the eye width detection process 60 are illustrated in the above descriptions, and will not be narrated hereinafter.

Figure 7:
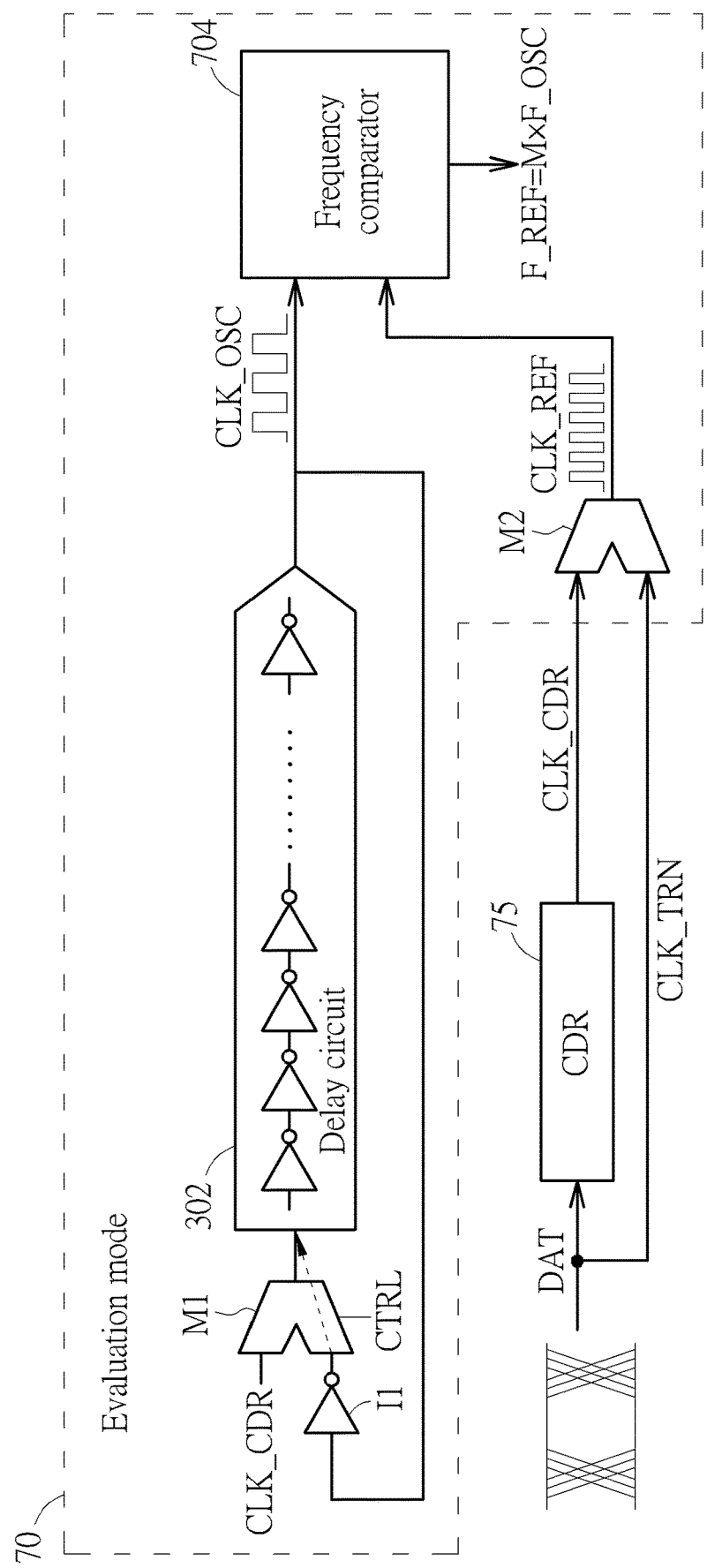
FIG. 7 is a schematic diagram of an EWM according to another embodiment of the present invention.

In another embodiment, before the sampling clocks CKD[1]-CKD[N] generated from the delay circuit are used to sample the input data DAT, the frequency relation of the oscillation clock CLK_OSC and the reference clock CLK_REF may be obtained. Please refer to FIG. 7, which is a schematic diagram of an EWM 70 according to another embodiment of the present invention. As shown in FIG. 7, the circuit structure of the EWM 70 is similar to the circuit structure of the EWM 30 shown in FIG. 3, so signals and elements having similar functions are denoted by the same symbols. The difference between the EWM 70 and the EWM 30 is that, the EWM 70 includes a frequency comparator 704 instead of the calibration circuit 304 of the EWM 30. The frequency comparator 704 is coupled to the delay circuit 302, and configured to receive the oscillation clock CLK_OSC from the delay circuit 302 and receive the reference clock CLK_REF from the MUX M2. Therefore, the frequency comparator 704 may compare the oscillation clock CLK_OSC with the reference clock CLK_REF to determine the ratio of the frequency of the reference clock CLK_REF to the frequency of the oscillation clock CLK_OSC.

Similarly, the EWM 70 may be coupled to a CDR circuit 75, for detecting the eye width of an input data DAT of the CDR circuit 75. The CDR circuit 75 is configured to receive the input data DAT and correspondingly output a CDR output clock CLK_CDR extracted from the input data DAT. Further, the CDR circuit 75 may have a clock training mode, where the CDR circuit 75 receives an input training clock CLK_TRN instead of the input data DAT. Based on the operations of the MUX M2, the reference clock CLK_REF may be selected from the CDR output clock CLK_CDR or the input training clock CLK_TRN.

FIG. 7 illustrates an evaluation mode, where the control signal CTRL controls the MUX M1 to select the second input terminal to be coupled to its output terminal. In such a situation, the output terminal of the delay circuit 302 may be coupled to its input terminal, so that the delay circuit 302 is connected as an oscillator. In the evaluation mode, the delay circuit 302 performs oscillation and outputs the oscillation clock CLK_OSC to the frequency comparator 704; hence, the frequency comparator 704 may perform comparison on the oscillation clock CLK_OSC with the reference clock CLK_REF.

In contrast to the calibration mode where the delay time of the delay circuit 302 is adjusted during the calibration process, the evaluation mode may not control or adjust the delay time; instead, the frequency comparator 704 compares and evaluates the frequency ratio between the oscillation clock CLK_OSC and the reference clock CLK_REF in the evaluation mode.

In an embodiment, the frequency (F_REF) of the reference clock CLK_REF may be M times the frequency (F_OSC) of the oscillation clock CLK_OSC; that is, $$F\_REF = M \times F\_OSC; \qquad (1)$$

where M may be any positive value such as an integer or fraction. The EWM 70 may record this value for subsequent calculations.

After the frequency ratio M is obtained, the EWM 70 may be switched to operate in a clock scanning mode, where the control signal CTRL controls the MUX M1 to select the first input terminal to be coupled to its output terminal. In such a situation, the delay circuit 302 is connected to the clock input terminal for receiving the CDR output clock CLK_CDR from the CDR circuit 75. The delay circuit 302 is operated as a delay line in the clock scanning mode, while operated as an oscillator in the evaluation mode.

Figure 8:
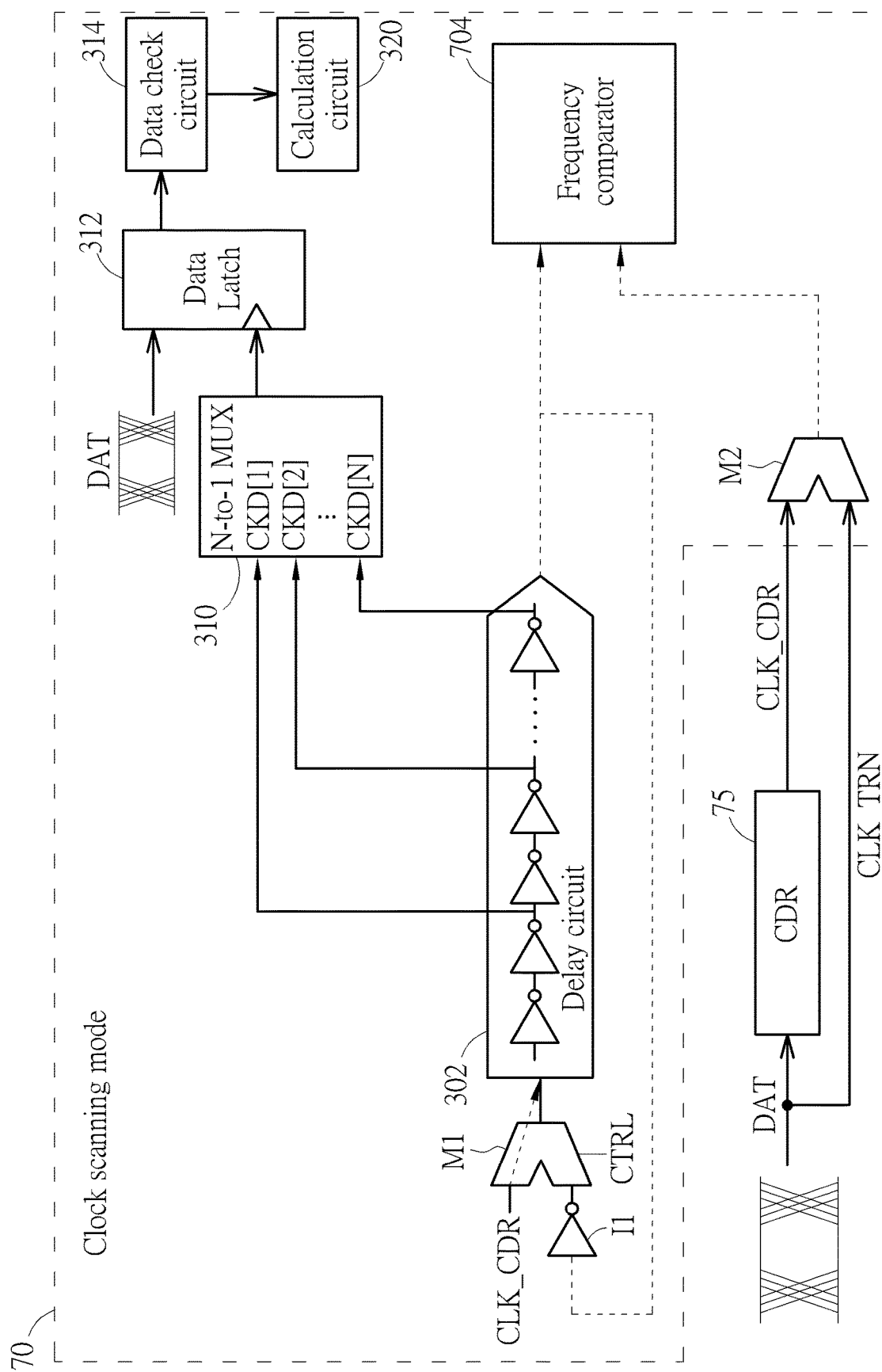
FIG. 8 is a schematic diagram of the EWM of FIG. 7 operated in the clock scanning mode.

Please refer to FIG. 8, which is a schematic diagram of the EWM 70 operated in the clock scanning mode. As shown in FIG. 8, the circuit structure of the EWM 70 is similar to the circuit structure of the EWM 30 shown in FIG. 4, so signals and elements having similar functions are denoted by the same symbols. The difference between the EWM 70 and the EWM 30 is that, the EWM 70 may further include a calculation circuit 320. The calculation circuit 320 is coupled to the data check circuit 314, and configured to calculate the eye width of the input data DAT of the CDR circuit 75.

Similarly, the N-to-1 MUX 310 may receive sampling clocks CKD[1]-CKD[N] having different phases from the delay circuit 302. The data latch 312 may receive the input data DAT of the CDR circuit 75, and receive the sampling clocks CKD[1]-CKD[N] from the N-to-1 MUX 310 in sequence. Therefore, the sampling clocks CKD[1]-CKD[N]

may sample the input data DAT in sequence, and the data check circuit 314 may thereby determine whether the sampled value obtained from each sampling clock CKD[1]-CKD[N] is accurate. The related sampling result may further be sent to the calculation circuit 320.

As shown in FIG. 8, the delay chain in the delay circuit 302 is composed of 2×N inverters, and the delay circuit 302 is configured to output N sampling clocks CKD[1]-CKD[N] having different phases (N is an integer greater than 1). Therefore, the phase shift T_CELL between every two consecutive sampling clocks (i.e., the delay time between CKD[i] and CKD[i+1]) may be equal to:

$$T\_CELL = \frac{T\_OSC}{2N} = \frac{1}{F\_OSC \times 2N}; \quad (2)$$

where T_OSC refers to an oscillation cycle length of the oscillation clock CLK_OSC, which is a reciprocal of the frequency F_OSC of the oscillation clock CLK_OSC.

Figure 9:
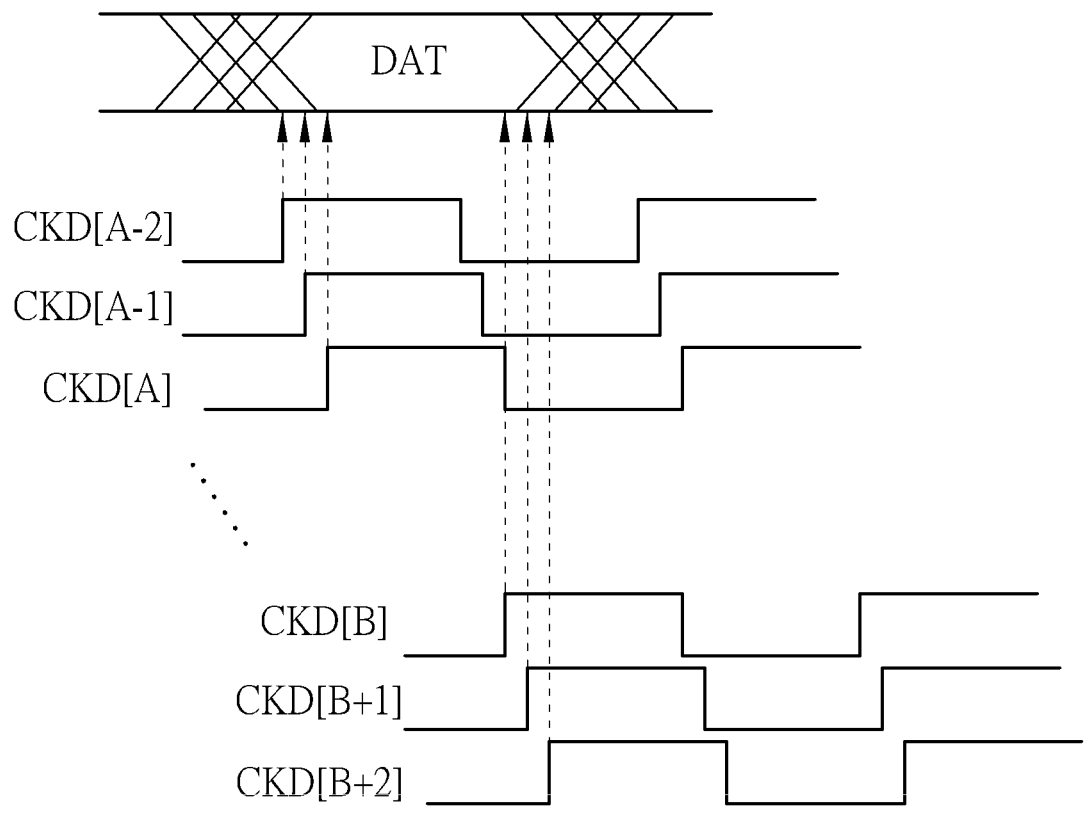
FIG. 9 is an exemplary waveform diagram of sampling the input data through the sampling clocks.

FIG. 9 is an exemplary waveform diagram of sampling the input data DAT through the sampling clocks CKD[1]-CKD[N]. As shown in FIG. 9, the accurate sampled value may be obtained through the sampling clocks from CKD[A] to CKD[B]. Accordingly, the data check circuit 314 may obtain the accurate clock number, which is equal to the number of sampling clocks from CKD[A] to CKD[B].

Therefore, the calculation circuit 320 may calculate the eye width of the input data DAT according to the ratio of the frequency of the reference clock CLK_REF to the frequency of the oscillation clock CLK_OSC and also according to the accurate clock number. In this embodiment, the eye width T_EW of the input data DAT may be equal to:

$$T\_EW=(B-A)\times T\_CELL. \quad (3)$$

By combining Equation (3) with Equations (1) and (2), the eye width T_EW may be obtained as follows:

$$T\_EW = (B-A) \times \left(\frac{M}{2N}\right) \times T\_UI;$$

where T_UI is a unit interval of the input data DAT, as a reciprocal of the frequency F_REF of the reference clock CLK_REF.

As can be seen, M is the frequency ratio obtained through the frequency comparator 704 in the evaluation mode, and (B−A) is the accurate clock number that represents the number of sampling clocks having the accurate sampled value. Also, N is a known value based on the structure of the delay circuit 302, and the value of T_UI may be easily obtained by receiving the related information from the transmitter side or detecting through an external detector. With the above information and calculation, the eye width T_EW of the input data DAT of the CDR circuit 75 may be obtained accurately.

In this embodiment, the relation of the oscillation frequency F_OSC of the delay circuit 302 connected as an oscillator and the reference clock's frequency F_REF from the CDR circuit is obtained in the evaluation mode. Afterwards, in the clock scanning mode, the sampling clocks CKD[1]-CKD[N] generated from the delay circuit 302 sequentially sample the input data DAT to determine the accurate clock number. The phase shift between every two consecutive sampling clocks is associated with the oscillation frequency F_OSC of the delay circuit 302, and therefore associated with the reference clock's frequency F_REF and the unit interval T_UI of the input data DAT. After the calculations, the eye width T_EW relative to the unit interval T_UI may be obtained based on the abovementioned information.

Figure 10:
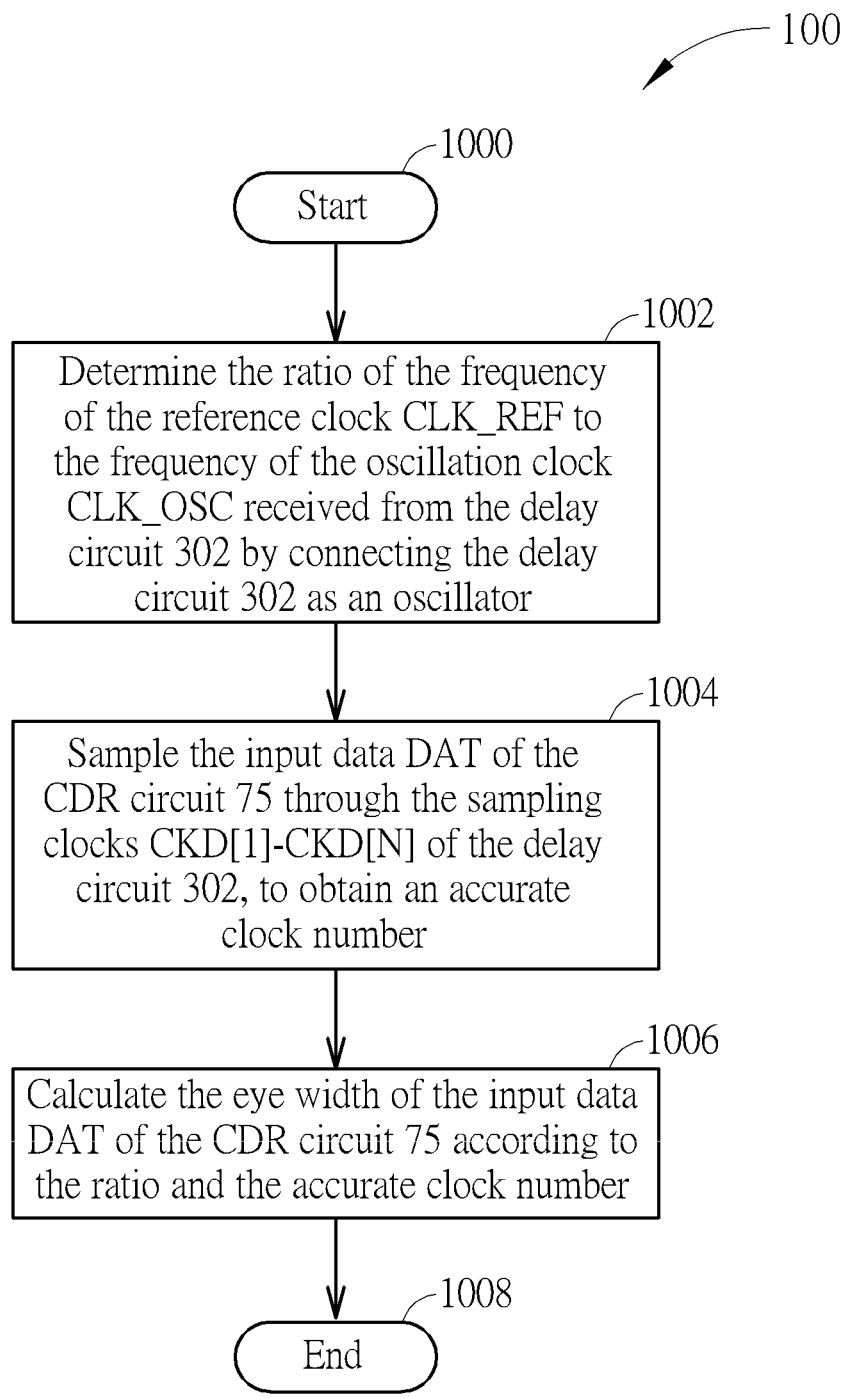
FIG. 10 is a flowchart of an eye width detection process according to an embodiment of the present invention.

The abovementioned operations of the EWM 70 may be summarized into an eye width detection process 100, as shown in FIG. 10. The eye width detection process 100 includes the following steps:

Step 1000: Start.

Step 1002: Determine the ratio of the frequency of the reference clock CLK_REF to the frequency of the oscillation clock CLK_OSC received from the delay circuit 302 by connecting the delay circuit 302 as an oscillator.

Step 1004: Sample the input data DAT of the CDR circuit 75 through the sampling clocks CKD[1]-CKD[N] of the delay circuit 302, to obtain an accurate clock number.

Step 1006: Calculate the eye width of the input data DAT of the CDR circuit 75 according to the ratio and the accurate clock number.

Step 1008: End.

The detailed implementations and operations of the eye width detection process 100 are illustrated in the above descriptions, and will not be narrated hereinafter.

Please note that the embodiments of the present invention aim at providing an EWM capable of accurately detecting the eye width of an internal signal of the integrated circuit (IC) such as the input data signal of the CDR circuit. Those skilled in the art may make modifications and alternations accordingly. For example, in the above embodiments, the delay circuit is composed of a delay chain having multiple inverters. In another embodiment, the delay circuit may be implemented in other manner, as long as the delay circuit is able to generate multiple sampling clocks having different phases. In addition, in the sampling operations described above, the accuracy of the sampled value may be determined in any possible manner. In an embodiment, each sampling clock CKD[1]-CKD[N] may be used to sample an input data DAT to determine its accuracy, and the data check circuit 314 may generate the sampling result accordingly. In another embodiment, a sequence of input data DAT may be sent to the EWM for eye width detection, and each sampling clock CKD[1]-CKD[N] may be used to sample this sequence of input data DAT. In this manner, a bit error rate (BER) may be obtained for each sampling clock CKD[1]-CKD[N] by sampling this sequence of input data DAT. The data check circuit 314 may thereby determine whether each sampling clock CKD[1]-CKD[N] can generate an accurate sampled value according to the BER. For example, the sampled value may be considered accurate if the BER is smaller than a threshold. The eye width detection based on the sequence of input data DAT may achieve a higher accuracy and reliability.

To sum up, the present invention provides a novel EWM and a related method of detecting the eye width of an internal signal of the IC. In the embodiments of the present invention, a delay circuit composed of a delay chain having multiple inverters may be applied to generate multiple sampling clocks. In an embodiment, before the sampling clocks are used to sample the input data for eye width detection, the delay circuit is connected as an oscillator, and the oscillation clock of the oscillator is calibrated to have the same frequency as a reference clock selected from the output clock or the input training clock of the CDR circuit. The EWM may include a calibration circuit served to adjust the delay time of the delay circuit during the calibration. The delay time information is thereby applied to generate the sampling clocks for sampling the input data. In an embodiment, before the sampling clocks are used to sample the input data for eye width detection, the delay circuit is connected as an oscillator, and the frequency relation of the oscillation clock of the oscillator and a reference clock selected from the output clock or the input training clock of the CDR circuit may be obtained. The EWM may include a frequency comparator served to determine the ratio of the reference clock's frequency to the oscillation clock's frequency. A calculation circuit is further applied to calculate the eye width according to the frequency ratio and also according to the accurate clock number obtained through the sampling operations. As a result, the eye width information may be obtained based on the calibrated delay time of the delay circuit, or based on the frequency relation between the CDR's operating frequency and the oscillation clock of the delay circuit. Therefore, the EWM and the method of eye width detection of the present invention may achieve an accurate detection result that may be immune to possible PVT variations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An eye width monitor (EWM) for a clock and data recovery (CDR) circuit, comprising:
   a delay circuit, comprising an input terminal and an output terminal;
   a first multiplexer, coupled to the delay circuit, the first multiplexer comprising:
      a first input terminal, coupled to a clock input terminal of the EWM;
      a second input terminal, coupled to the output terminal of the delay circuit; and
      an output terminal, coupled to the input terminal of the delay circuit; and
   a calibration circuit, coupled to the delay circuit, configured to receive an oscillation clock from the delay circuit and receive a reference clock, and calibrate the oscillation clock with the reference clock;
   wherein the delay circuit is configured to output a plurality of sampling clocks to perform eye width detection based on the calibrated oscillation clock.

2. The EWM of claim 1, further comprising:
   a second multiplexer, coupled to the calibration circuit, configured to select an output clock of the CDR circuit or an input training clock of the CDR circuit to be served as the reference clock.

3. The EWM of claim 1, wherein the calibration circuit is configured to control a delay configuration of the delay circuit, in order to calibrate the oscillation clock.

4. The EWM of claim 3, wherein the delay circuit is configured to output the plurality of sampling clocks for sampling an input data of the CDR circuit under the delay configuration corresponding to the oscillation clock after being calibrated.

5. The EWM of claim 1, wherein the first multiplexer is configured to select the second input terminal in a first operation mode, and select the first input terminal in a second operation mode following the first operation mode.

6. The EWM of claim 5, wherein the delay circuit is connected as an oscillator in the first operation mode.

7. The EWM of claim 5, wherein the delay circuit is configured to receive an output clock of the CDR circuit in the second operation mode.

8. The EWM of claim 1, wherein the calibration circuit is configured to calibrate a frequency of the oscillation clock to be the same as a frequency of the reference clock.

* * * * *